(12) United States Patent
Yang et al.

(10) Patent No.: US 7,807,579 B2
(45) Date of Patent: Oct. 5, 2010

(54) HYDROGEN ASHING ENHANCED WITH WATER VAPOR AND DILUENT GAS

(75) Inventors: Chan-Syun Yang, Beverly Hills, CA (US); Changhun Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 758 days.

(21) Appl. No.: 11/737,731

(22) Filed: Apr. 19, 2007

(65) Prior Publication Data

US 2008/0261405 A1 Oct. 23, 2008

(51) Int. Cl.
*H01L 21/302* (2006.01)

(52) U.S. Cl. .................. 438/706; 438/318; 438/322; 438/692; 438/702; 430/329; 430/330; 216/63; 216/67; 216/69; 216/72; 257/758

(58) Field of Classification Search .............. 438/706, 438/318, 322, 692, 694, 702; 430/329, 330; 216/67, 63, 69, 72; 257/758
See application file for complete search history.

(56) References Cited

U.S. PATENT DOCUMENTS

| | | | |
|---|---|---|---|
| 5,660,682 A | 8/1997 | Zhao et al. .................. 438/715 |
| 5,895,245 A | 4/1999 | Harvey et al. ................ 438/305 |
| 6,316,354 B1 | 11/2001 | Hu ............................... 438/652 |
| 6,340,435 B1 | 1/2002 | Bjorkman et al. ............. 216/72 |
| 6,562,700 B1 | 5/2003 | Gu et al. ....................... 438/477 |
| 6,630,406 B2 | 10/2003 | Waldfried et al. ........... 438/710 |
| 6,669,858 B2 | 12/2003 | Bjorkman et al. ............ 216/72 |
| 6,806,038 B2 * | 10/2004 | Gu et al. ...................... 430/318 |
| 6,834,656 B2 | 12/2004 | Qingyuan et al. ............ 134/13 |
| 6,849,559 B2 | 2/2005 | Balasubramaniam et al. .... 438/758 |
| 6,858,153 B2 | 2/2005 | Bjorkman et al. ............ 216/72 |
| 6,951,823 B2 * | 10/2005 | Waldfried et al. ........... 438/710 |
| 2001/0024769 A1 * | 9/2001 | Donoghue et al. ........... 430/329 |
| 2005/0023694 A1 | 2/2005 | Bjorkman et al. ............ 257/758 |
| 2006/0091355 A1 | 5/2006 | Itano et al. .................. 252/79.1 |

* cited by examiner

*Primary Examiner*—Lan Vinh
*Assistant Examiner*—Maki A Angadi
(74) *Attorney, Agent, or Firm*—Law Offices of Charles Guenzer

(57) ABSTRACT

An oxygen-free hydrogen plasma ashing process particularly useful for low-k dielectric materials based on hydrogenated silicon oxycarbide materials. The main ashing step includes exposing a previously etched dielectric layer to a plasma of hydrogen and optional nitrogen, a larger amount of water vapor, and a yet larger amount of argon or helium. Especially for porous low-k dielectrics, the main ashing plasma additionally contains a hydrocarbon gas such as methane. The main ashing may be preceded by a short surface treatment by a plasma of a hydrogen-containing reducing gas such as hydrogen and optional nitrogen.

20 Claims, 2 Drawing Sheets

HYDROGEN ASHING ENHANCED WITH WATER VAPOR AND DILUENT GAS

FIELD OF THE INVENTION

The invention relates generally to plasma etching of materials in the fabrication of integrated circuits. In particular, the invention relates to ashing of photoresist.

BACKGROUND ART

Plasma etching is widely used in the fabrication of silicon integrated circuits. One of its uses, often called dielectric etching, is used to form holes through dielectric layers to provide vertical electrical connections between different levels of the integrated circuit. A prototypical via structure is schematically illustrated in the cross-sectional view of FIG. 1. A lower dielectric layer 10 formed on the surface of a wafer has a conductive feature 12 formed in its surface. An upper dielectric layer 14 is deposited over the lower dielectric layer 10 and its conductive feature 12. A planar photoresist layer 16 is spun onto the so far unpatterned upper dielectric layer 14 and a stepper photographically exposes it according to a pattern of radiation to form a mask aperture 18 through the photoresist layer 16 to thereby form a photomask with the mask aperture 18 overlying the conductive feature 12 to be electrically contacted through a via. There may be additional layers formed between the upper dielectric layer 14 and the photoresist layer 16 such as an etching hard mask or an anti-reflection coating. The photomasked wafer is placed into a plasma etch reactor, which etches through the upper dielectric layer 14 down to the conductive feature to form a via hole 20. Typically, the same etch reactor also etches through the anti-reflection coating and hard mask, if any, with the etching chemistry being changed between the layers. The dielectric etching is typically based on a fluorocarbon chemistry, for example, using hexafluorobutadiene ($C_4F_6$).

After the dielectric etching, the via hole 20 is filled with a metal such as aluminum or copper to provide a vertical electrical connection to the conductive feature 12. For a dual-damascene structure typically used with copper metallization, the via hole 20 is replaced by a shorter via hole at the bottom of the upper dielectric layer 14 connected to a horizontally extending trench at the top, both of which are simultaneously filled with copper. For a contact-layer metallization, the lower dielectric layer 10 is replaced by an active silicon layer and the conductive feature 12 is also composed of silicon although there may be complex silicides and gate oxides at the interface with the via hole 20, which in this case is properly called a contact hole.

At the completion of dielectric etching, some of the photoresist may remain on top of the dielectric layer 14 or etching residues, often of a carbonaceous composition, may remain in the via hole 18. The residues may form a polymeric coating 22 on the sides of the via hole 20, which assists in producing a vertical etching profile, or form isolated etch residues 24 including some at the bottom of the via hole 20. Similar polymeric coatings may cover the remainder of the photoresist to produce a hardened outer surface. The metal filling process requires that the via hole 20 be coated with a conformal liner including barrier layers and, in the case of copper metallization performed by electrochemical plating (ECP), a copper layer acting a seed layer and electroplating electrode. Currently, the barrier layer is typically a bilayer of TaN/Ta and it and the copper seed layer may be deposited by advanced forms of sputtering. It is important that the photoresist and other residues be removed from the structure prior to deposition of the layers lining the via hole since they degrade adhesion to the via sidewalls and increase contact resistance at the via bottom and in both cases affect device yield and reliability.

Plasma ashing has long been practiced to remove photoresist and other residues after etching. An oxygen plasma is very effective at etching away carbon-based layers. Although ashing was previously performed in a barrel asher designed for batch processing a large number of wafers, more current technology uses single-wafer plasma ashers, either as separate etch reactors or in a separate processing step performed in the same plasma etch reactor used for dielectric etching.

Conventional ashing is effective when the dielectric layer are formed of silicon dioxide (silica) having an approximate chemical composition of $SiO_2$ having a dielectric constant of around 3.9. Ashing has however presented difficulties when applied to more advanced low-k dielectrics needed for advanced integrated circuits. Early low-k dielectrics were formed by doping silica with fluorine to reduce the dielectric constant to about 3.5. Even lower dielectric constants in the low-3 range can be obtained by a hydrogenated silicon oxycarbide material, such as Black Diamond dielectric available from Applied Materials of Santa Clara, Calif. Still lower dielectric constants of less than 3 have been obtained by depositing such materials to be porous. Oxygen ashing of these materials causes many problems. The oxygen plasma not only attacks the carbonaceous photoresist remnants and other residue, it also tend to deplete the carbon content of the silicon oxycarbide and increases its dielectric constant. Porous dielectric materials are relatively fragile and even more prone to damage from the oxygen plasma due to partial penetration of oxygen into the pores and the collapse of the pores.

Accordingly, advanced ashing has shifted from the oxidizing chemistry of an oxygen plasma to a reducing chemistry of a plasma formed of some combination of hydrogen and possibly nitrogen, for example, $H_2$, $H_2/N_2$, or $NH_3$. Ashing based on hydrogen radicals H* exhibits higher performance and less dielectric damage than oxygen ashing. However, hydrogen ashing is a very slow process due to a low reducing reaction rate and the low hydrogen radical density generated in an environment of only reducing gases. While oxygen ashing may require 20 seconds of processing, hydrogen ashing may require ten times as long, clearly an economic disadvantage. Accordingly, often a small amount of oxygen may be added to the reducing gas to increase the ashing rate and ashing efficiency. However, porous low-k materials are sensitive even to small amounts of oxygen, which can remove significant carbon from the silicon oxycarbide material and collapse the pore structure and increase the dielectric constant.

SUMMARY OF THE INVENTION

An oxygen-free plasma ashing process is performed in which the main ashing includes a plasma formed from hydrogen gas, optional nitrogen gas, water vapor, and an otherwise inactive or diluent gas such as argon or helium. Ammonia may replace the hydrogen and nitrogen. The plasma is formed from more water vapor than hydrogen gas, and more inactive gas than water vapor.

The ashing is particularly useful for low-k dielectric materials containing carbon as well as silicon oxide, for example, hydrogenated silicon oxycarbide.

Optionally, a hydrocarbon gas, such as methane, may be added to the plasma of the main ashing step. The addition of hydrocarbon is particularly useful for porous low-k dielectric materials, for example, having a dielectric constant less than three.

An initial oxygen-free plasma ashing or surface treating step includes a plasma formed from a hydrogen-containing reducing gas, such as hydrogen or ammonia, and optional nitrogen gas but no water vapor. The surface treating step may be shorter than the main ashing step.

DETAILED DESCRIPTION OF THE PREFERRED EMBODIMENTS

The addition of water vapor and a large amount of argon or helium to the hydrogen-based ashing plasma greatly increases the concentration of hydrogen radicals and increases the ashing rate with reduced damage to low-k dielectrics.

Figure 1:
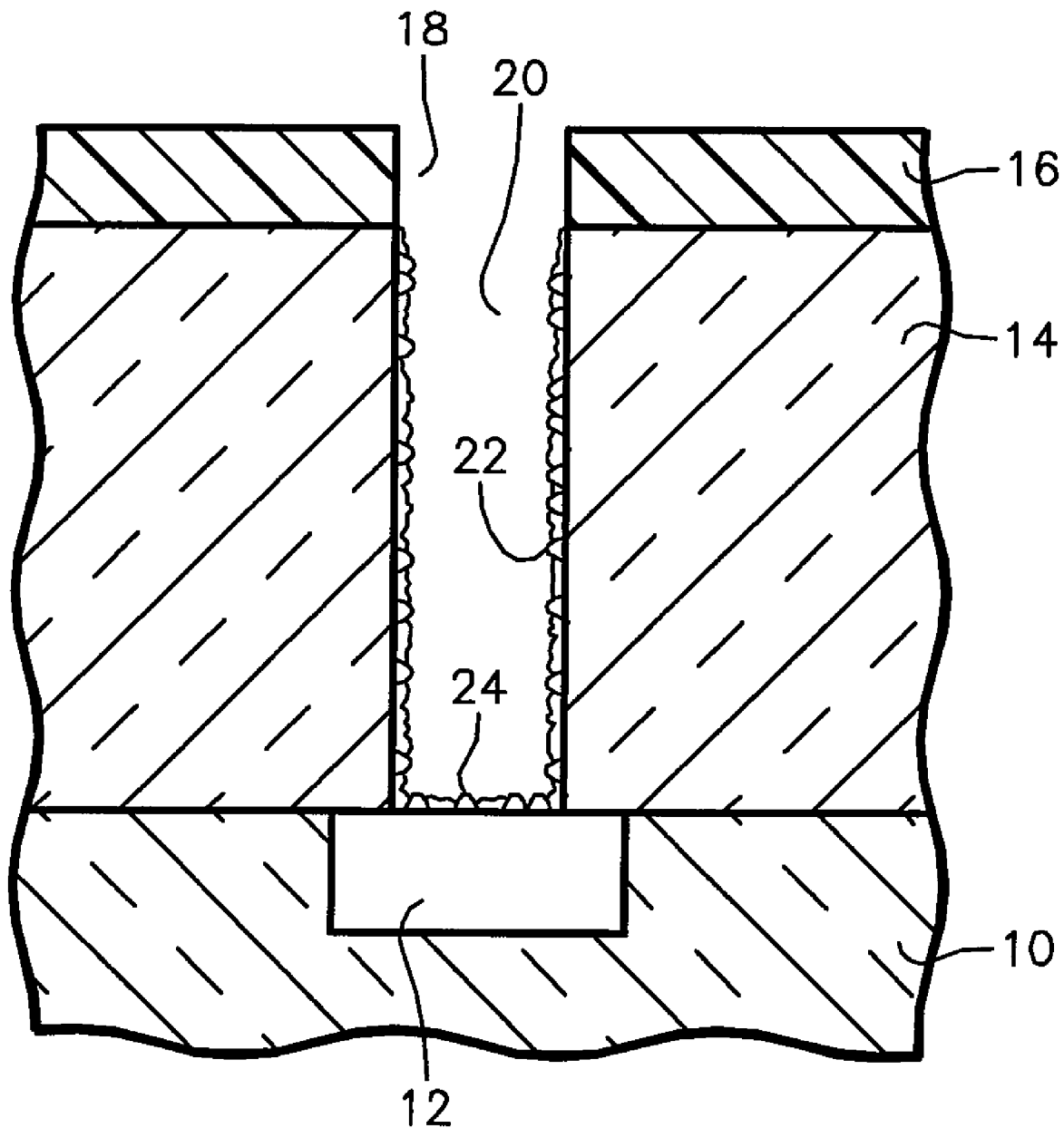
FIG. 1 is a cross-sectional view of a via hole after dielectric etching including residual photoresist, sidewall polymeric coating, and other etch residue to be removed by ashing.
Figure 2:
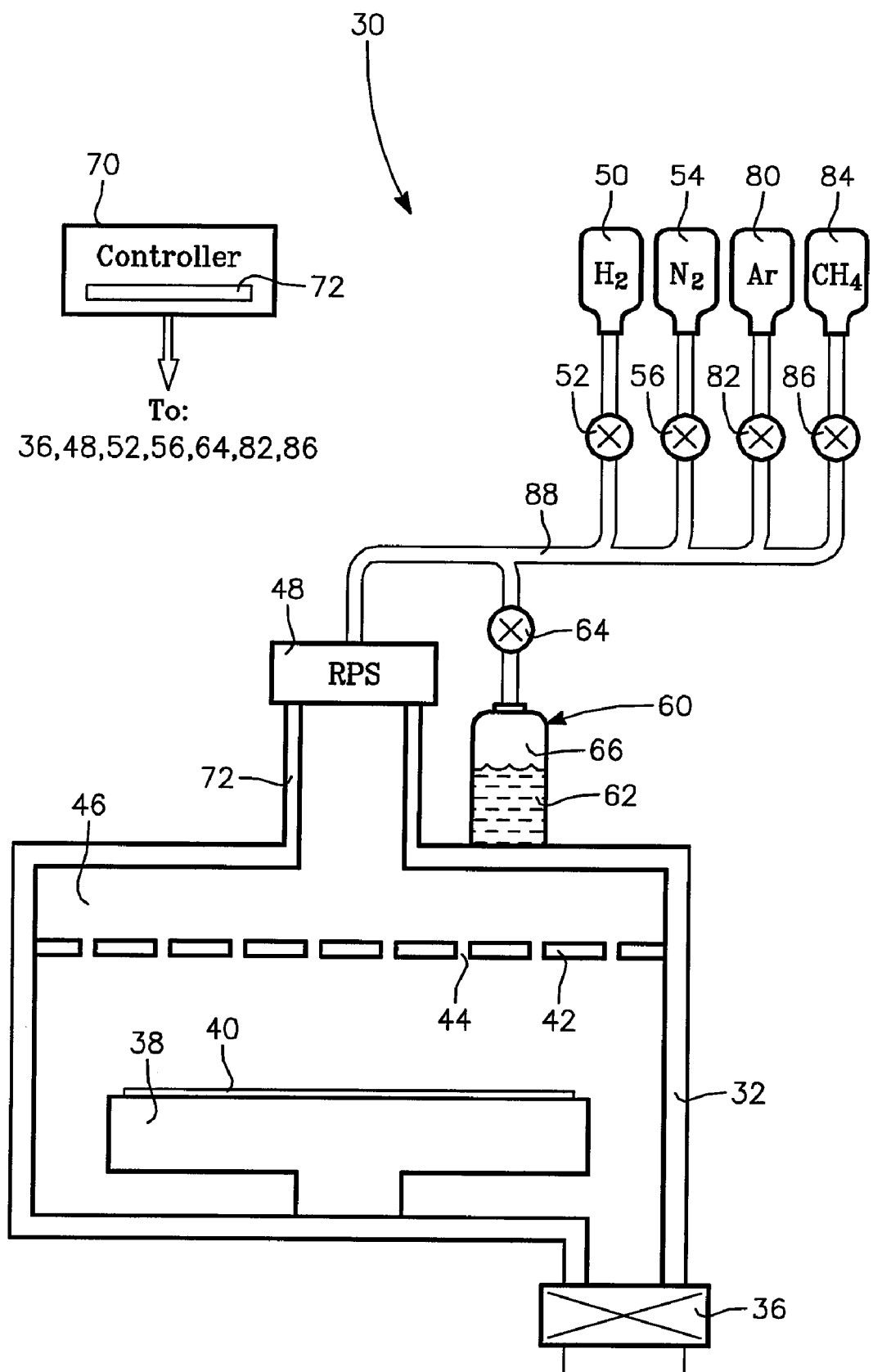
FIG. 2 is a schematic cross-sectional view of a plasma asher usable with the invention.

The invention may be practiced in a plasma ashing reactor 30, schematically illustrated in the cross-sectional view of FIG. 2. A vacuum processing chamber 32 is pumped by a vacuum pumping system 36 to the low Torr range. A pedestal 38 within the chamber 32 supports a wafer 40 to be ashed in opposition to a gas showerhead 42 supplying a process gas through a large number of apertures 44.

The process gas is supplied to a manifold 46 in back of the showerhead 42 through a remote plasma source 48 which excites the process gas into a plasma. The remote plasma source 48 may be located a distance away from the vacuum chamber 48 but is still considered ancillary to it since the gas containing the plasma generated in the remote plasma source 48 flows into the vacuum chamber 48 in its active plasma state. Preferably, mostly radicals and relatively few plasma ions are delivered into the processing chamber 32. Some of the details of the remote plasma source and the manifold are disclosed by Fu in U.S. patent application Ser. No. 11/351,676, filed Feb. 10, 2006. The remote plasma source 48 may utilize a microwave excitation source operating in the low gigahertz range, for example, 2.54 GHz, or an RF excitation source operating in the sub-gigahertz range, for example, 270 to 650 kHz. The remote plasma source 48 advantageously includes a charged particle filter so that the plasma delivered to the chamber contains only neutral radicals and no charged ions. If hydrogen gas ($H_2$) is used as the primary ashing gas, it is supplied to the remote plasma source 48 from a hydrogen gas source 50 through a mass flow controller 52. Nitrogen gas ($N_2$) may be supplied from a nitrogen gas source 54 through another mass flow controller 56. Nitrogen tends to act as a passivator for hydrogen radical etching.

Water vapor ($H_2O$) is supplied to the remote plasma source 48 from a vacuum-sealed water ampoule 60 containing a pool 62 of liquid water. A mass flow controller 64 meters water vapor from the ampoule 60. The vapor pressure of water at room temperature is about 20 Torr, which is well above the usual vacuum levels at which the remote plasma source 48 operates. Accordingly, once the ampoule 60 has been back pumped, a water vapor having a pressure of about 20 Torr exists in a head space 66 above the liquid water pool 62 in the ampoule 60. The ampoule 60 may be mounted directly on the chamber 32 to minimize the length of tubing, on the walls of which water is likely to condense.

A controller 70 acting in accordance with a recipe inserted into the controller 70 in a recordable medium 72 such as a CDROM controls the pumping system 36, the remote plasma source 48, and the various mass flow controllers including the mass flow controllers 52, 56, 64 already described as well as others.

According to the invention, an otherwise inactive gas such as argon (Ar) is supplied from an argon gas source 80 metered by a mass flow controller 82. Helium (He) may be substituted for the argon. The argon promotes dissociation of $H_2O$ to H* and OH* in what is believed to be a Penning process in which the energy of an excited argon radical is transferred to the water components. Thereby, a much higher density of hydrogen radicals H* is produced from the water vapor than is possible with $H_2$ alone. As a result, although argon and helium are usually considered to be inactive diluent gases, it is believed that they remain inactive in the actual ashing but promote the generation of a high density of active ashing radicals. Nonetheless, $H_2$ advantageously included in the recipe suppresses the generation of oxygen radicals O*. Further, $N_2$ is advantageously added to not only enhance the dissociation of $H_2O$ but also to provide some passivation during the ashing process.

One embodiment of the process of ashing hydrogenated silicon oxycarbide is a two-step process tabulated in TABLE 1 with process gas flows presented in units of standard cubic centimeters (sccm).

TABLE 1

|  | Step 1 | Step 2 |
| --- | --- | --- |
| $H_2$ (sccm) | 600 | 600 |
| $N_2$ (sccm) | 100 |  |
| $H_2O$ (sccm) |  | 1000 |
| Ar (sccm) |  | 3000 |
| Pressure (Torr) | 1 | 1 |
| RPS Power (W) | 5000 | 5000 |
| Time (s) | 20 | 60 |

The first step is a moderately soft etch or surface treatment and does not harden the surface of the photoresist or the polymeric sidewall coating. The first step is based primarily on a hydrogen reducing chemistry and hence is slow. However, it is intended only to etch away the surface. The $H_2/N_2$ may be replaced other reducing gases such as $H_2$ alone or ammonia ($NH_3$). The second step is intended to quickly remove the bulk part of the photoresist and residue. The second step is the main ashing step and is longer than the initial surface treating step.

It is understood the summarized recipe is only representative of the process of the invention. The pressure range is easily extended to 0.5 to 5 Torr; the RPS source power range, to 2 kW to 8 kW for a 300 mm chamber; the hydrogen flow to 200 to 2000 sccm, the argon flow to 3000 to 10,000 sccm; and the water vapor flow to 500 to 3000 sccm. As mentioned before, helium may be substituted for argon. In general terms, in the first step, predominantly hydrogen is supplied but a lesser amount of nitrogen may be supplied. In the second step, more argon than water and less hydrogen than water vapor are supplied. Oxygen gas or its radical form of ozone is not supplied in either step.

The main ashing process of the second step may be practiced without the preliminary surface treatment of the first step or with some other type of preliminary treatment.

The recipe of TABLE 1 is effective for non-porous low-k dielectrics of hydrogenated silicon oxycarbide. However, for the now favored porous low-k dielectrics of the same general composition, additional passivation is desired. Accordingly, a hydrocarbon, such as methane ($CH_4$), may be supplied from a hydrocarbon gas source 84 through another mass flow controller 86, but other carbon- and hydrocarbons consisting of hydrogen and carbon may be substituted, such as ethane ($C_2H_6$), ethylene ($C_2H_4$), and acetylene ($C_2H_2$) as well as higher alkanes, alkenes, alkynes, and the like. A recipe preferred for porous low-k dielectrics is tabulated in TABLE 2.

TABLE 2

|  | Step 1 | Step 2 |
| --- | --- | --- |
| $H_2$ (sccm) | 600 | 600 |
| $N_2$ (sccm) | 100 |  |
| $H_2O$ (sccm) |  | 1000 |
| Ar (sccm) |  | 3000 |
| $CH_4$ (sccm) |  | 20 |
| Pressure (Torr) | 1 | 1 |
| RPS Power (W) | 5000 | 5000 |
| Time (s) | 20 | 60 |

The recipe of TABLE 2 closely follows that of TABLE 1 except for the addition in the second step of an amount of methane substantially less than the other components. The small amount of hydrocarbon is believed to passivate and protect the exposed porous low-k dielectric by sealing the pores of the dielectric material and prevent the etching plasma, particularly the oxygen component, from penetrating deep within the pores and degrading the dielectric material.

The invention is not limited to a plasma asher using a remote plasma source but can be practiced in a plasma diode etch reactor in which the plasma is generated within the vacuum chamber adjacent the wafer or other substrate but the ionic content of the plasma needs to be minimized. Further, the invention is not limited to the described low-k dielectric of hydrogenated silicon oxycarbide but can be applied to other types of dielectric materials and indeed may be applied to ashing after a metal or silicon etching process.

The invention thus provides fast but protective ashing process particularly useful in ashing low-k dielectric materials.

The invention claimed is:

1. An ashing process comprising a main ashing step, comprising:
    supplying to a remote plasma source a main ashing gas comprising a first amount of a reducing gas selected from the group consisting of hydrogen gas and ammonia gas, a second amount of water vapor, and a third amount of a diluent gas selected from the group consisting of argon and helium, wherein the second amount is greater than the first amount, wherein the third amount is greater than the second amount, and wherein the main ashing gas does not contain an amount of oxygen gas effective at ashing the substrate during the main ashing step;
    generating in the remote plasma source a plasma from the main ashing gas;
    removing ions from the plasma in a charged particle filter; and
    applying to the substrate the plasma output by the charged particle filter.

2. The process of claim 1, wherein the reducing gas comprises hydrogen gas.

3. The process of claim 1, wherein the reducing gas comprises ammonia gas.

4. An ashing process comprising a main ashing step of applying to a substrate a plasma of a main ashing gas comprising a first amount of a reducing gas selected from the group consisting of hydrogen gas and ammonia gas, a second amount of water vapor, a third amount of a diluent gas selected from the group consisting of argon and helium, and a fourth amount of a hydrocarbon gas,
    wherein the second amount is greater than the first amount, wherein the third amount is greater than the second amount, and wherein the main ashing gas does not contain an amount of oxygen gas effective at ashing the substrate during the main ashing step.

5. The process of claim 4, wherein the fourth amount is less than the first amount.

6. The process of claim 4, wherein the hydrocarbon gas comprises methane.

7. The process of claim 5, wherein the substrate includes a dielectric layer having a hole therein that is subject to the ashing process.

8. The process of claim 7, further comprising a preceding step of etching the hole in the dielectric layer according to a photoresist mask.

9. The process of claim 1, further comprising an initial ashing step, performed prior to the main ashing step, of applying to the substrate a plasma of an initial ashing gas including a fourth amount of a hydrogen-containing reducing gas and no amount of water vapor or of a hydrocarbon which would be effective at ashing the substrate during the initial ashing step, wherein the initial ashing gas and the main ashing gas include respective constituent gases differing between the initial and main ashing gases.

10. The process of claim 9, wherein the hydrogen-containing reducing gas comprises hydrogen gas.

11. The process of claim 10, wherein the initial ashing gas further comprises a fifth amount of nitrogen gas which is smaller than the fourth amount.

12. The process of claim 9, wherein the substrate includes a dielectric layer having a hole therein that is subject to the ashing process.

13. The process of claim 12, further comprising the preceding step of etching the hole in the dielectric layer according to a photoresist mask.

14. A process of ashing a substrate having dielectric layer with a hole previously etched therein, comprising the steps performed in a plasma etch chamber in which the substrate is disposed and ancillary apparatus:
    a first step of exciting into a first plasma a first gas mixture comprising a first amount of hydrogen gas and no amounts of oxygen and water vapor effective at ashing the substrate during the first step;
    a subsequent second step of exciting into a second plasma a second gas mixture comprising a second amount of hydrogen gas, a third amount of water vapor, and a fourth amount of an inactive gas selected from the group consisting of argon and helium, wherein the second gas mixture contains no amount of oxygen which would be effective at ashing the substrate during the second step;
    wherein the first and second gas mixtures contain respective gas components differing between the first and second gas mixtures.

15. The process of claim 14, wherein the second step is performed for a longer time than the first step.

16. The process of claim 14, wherein the ancillary apparatus includes a remote plasma source in which the first and second plasmas are excited and thereafter flow into the chamber through a charged particle filter to remove ions from the first and second plasmas.

17. The process of claim 14, wherein the first gas mixture additionally comprises nitrogen.

18. The process of claim 14, wherein the second gas mixture additionally comprises a fifth amount of a hydrocarbon gas and the first gas mixture includes no hydrocarbon gas effective at ashing the substrate during the first step.

19. The process of claim 18, wherein the hydrocarbon gas comprises methane.

20. The process of claim 14, wherein the third amount is greater than the second amount and less than the fourth amount.

* * * * *